(12) United States Patent
Ostromek

(10) Patent No.: US 6,449,295 B1
(45) Date of Patent: Sep. 10, 2002

(54) METHOD AND SYSTEM FOR GENERATING LASER LIGHT

(75) Inventor: Timothy Everett Ostromek, Garland, TX (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/447,940

(22) Filed: Nov. 23, 1999

(51) Int. Cl.[7] .............................. H01S 3/10; H01L 29/93
(52) U.S. Cl. .............................. 372/25; 372/34; 372/36; 257/601; 257/625; 257/706
(58) Field of Search ........................... 372/36, 25, 34; 257/601, 625, 706, 713, 910

(56) References Cited

U.S. PATENT DOCUMENTS

| | | | |
|---|---|---|---|
| 5,414,370 A | * | 5/1995 | Hashinaga et al. ......... 324/760 |
| 5,526,373 A | | 6/1996 | Karpinski .................... 372/101 |
| 5,898,211 A | | 4/1999 | Marshall et al. ............ 257/601 |

OTHER PUBLICATIONS

International Search Report in PCT International Application No. PCT/US00/41716, dated May 4, 2001.

* cited by examiner

*Primary Examiner*—Paul Ip
*Assistant Examiner*—Cornelius H Jackson
(74) *Attorney, Agent, or Firm*—Baker Botts L.L.P.

(57) ABSTRACT

A laser system is disclosed. The system comprises laser emitters (102, 104, and 106) forming a laser stack (108). A heater resistor (110) coupled to the laser stack (108) stabilizes the temperature of the laser stack (108). A heat reservoir (112) coupled to the laser stack (108) stores the heat flow from and releases the heat flow to the laser stack (108). A temperature monitor (114) coupled to the laser stack (108) monitors the temperature of the laser stack (108).

19 Claims, 1 Drawing Sheet

METHOD AND SYSTEM FOR GENERATING LASER LIGHT

TECHNICAL FIELD OF THE INVENTION

This invention relates generally to the field of light emission devices and more specifically to a method and system for generating laser light.

BACKGROUND OF THE INVENTION

Applications that require fixed, stable laser wavelengths, for example laser range finding, consume a significant amount of electrical power in order to keep the laser module at a constant temperature. Solid state laser diodes typically have an output wavelength that is temperature dependent, and thus they need go be maintained at a constant temperature and below a specified maximum temperature. The maximum temperature depends on the module material and construction, but is generally in the range of 95° C. to 125° C. Stabilizing the temperature of laser modules, however, is difficult. When the laser emits a laser pulse, the temperature of the laser emitter rapidly increases and then rapidly decreases. Moreover, laser Todules generally have significant thermal inertia, because they have a mass of generally 50–100 grams and are in thermal contact with the rest of the system. Consequently, efficiently stabilizing the temperature of laser modules has proven to be difficult.

A known method and system for generating laser light uses a thermo-electric cooler and an electrical heater to stabilize the temperature of a laser emitter. The cooling unit is used to cool the laser emitter, and the heater stabilizes the temperature of the laser assembly. Heating the laser assembly, however, consumes power. Moreover, cooling the laser emitter with a cooling unit consumes even more power. Additionally, providing a cooling unit to the laser assembly is costly.

While these methods and systems have provided a significant improvement over prior approaches, the challenges in the field of light emission devices have continued to increase with demands for more and better techniques having greater efficiency. Therefore, a need has arisen for a new method and system for generating laser light.

SUMMARY OF THE INVENTION

In accordance with the present invention, a method and system for generating laser light are provided that substantially eliminate or reduce disadvantages and problems associated with previously developed systems and methods.

According to one embodiment of the invention, a laser system is disclosed. The system comprises laser emitters forming a laser stack. A heater resistor is coupled to the laser stack and is operable to stabilize the temperature of the laser stack. A heat reservoir is also coupled to the laser stack and is operable to store the heat flow from and release the heat flow to the laser stack. A temperature monitor is coupled to the laser stack and operable to monitor the temperature of the laser stack.

According to one embodiment of the invention, a six-step method for generating laser light is disclosed. Step one calls for monitoring the heat flow of a laser stack. Step two provides initiating the stabilization of the temperature of the laser stack using a heater resistor. Step three requires emitting a laser pulse during an on-time. In step four, the method provides for conducting the heat flow from the laser stack to a heat reservoir. The next step calls for stopping the laser pulse during an off-time. The last steps calls for directing the heat flow to a laser case.

A technical advantage of the present invention is that it does not require a cooling unit, resulting in a lowered power consumption and cost. Another technical advantage of the present invention is that only the temperature of the emitters, and rot the entire laser assembly, is stabilized, lowering power consumption. Another technical advantage of the present invention is that the emitter heat flow is passively stabilized, again lowering power consumption.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
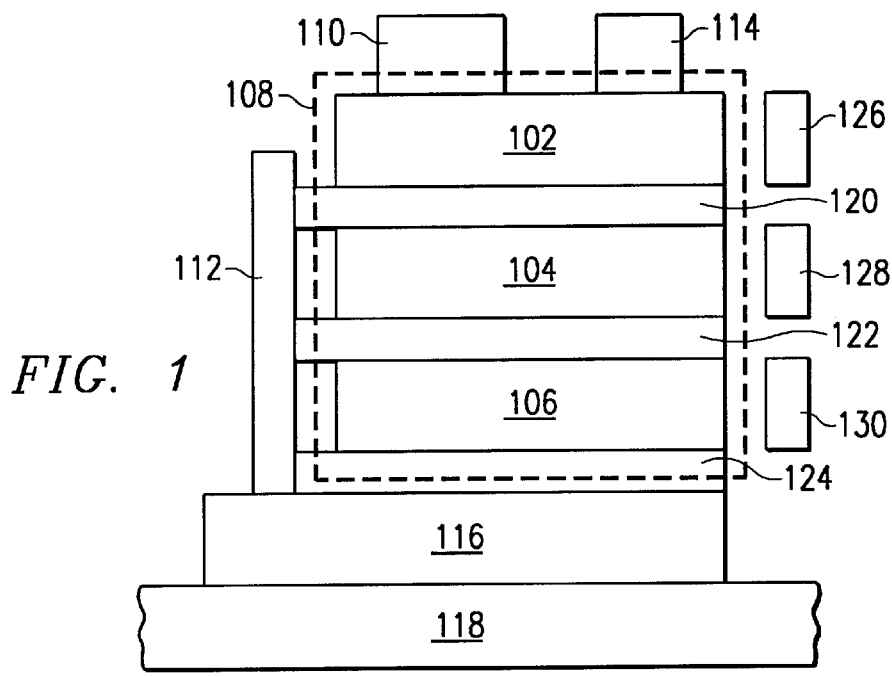
FIG. 1 is a system block diagram of one embodiment of a system in accordance with the present invention.

FIG. 1 is a block diagram of one embodiment of a system in accordance with the present invention. In this embodiment, three laser emitters 102, 104, and 106, form a laser stack 108. The laser emitters 102, 104, and 106 emit a laser pulse during an on-time and stop the laser pulse during an off-time period. The on-time may be less than the off-time period. The laser emitters 102, 104, and 106 may comprise, for example, gallium arsenide. A heater resistor 110 is coupled to the laser stack 108, and operates to stabilize the temperature of the laser stack 108. The heater resistor 110 may be placed on the laser stack 108 in order to stabilize the temperature of laser stack 108, and not the entire laser assembly. A heat reservoir 112 is coupled to the laser stack 108, and operates to store the heat flow from the laser stack 108 and release the heat flow to the case spacer 116 and the laser stack 108. The heat reservoir 112 may absorb the heat during the on-time of the laser stack 108. Since the on-time is relatively short, the thermal capacitance of the reservoir 112 may be small. The heat reservoir 112 may comprise, for example, diamond or copper. A temperature monitor 114 is coupled to the laser stack 108, and operates to monitor the temperature of the laser stack 108. The temperature monitor may comprise, for example, a thermistor.

The system may further comprise thermal conductors for conducting heat to and from the laser stack 108. A thermal conductor may comprise, for example, a case spacer 116 coupled to the laser stack. The case spacer 116 may comprise, for example, ceramic and may operate to conduct the flow of heat from the laser stack 108 to a laser case 118. The case spacer 116 may have a high thermal impedance in order to conduct the minimum heat flow to the laser case 118 such that the temperature of the laser stack 108 falls to approximately the operating temperature during the off-time of the laser stack 108. The thermal conductors may also comprise reservoir spacers 120, 122, and 124, coupled to the heat reservoir 112 and the laser emitters 102, 104, and 106. The reservoir spacers 120, 122, and 124 may operate to conduct heat to and from the laser stack 108 and the heat reservoir 112, and may comprise, for example, diamond, copper or beryllium oxide.

The system may also comprise receivers 126, 128, and 130 operable to receive light emitted from the laser stack 108. The receivers 126, 128, and 130 may comprise, for example, output light couplings, optic fibers, diffractive or geometric optic components, or lenses.

Figure 2:
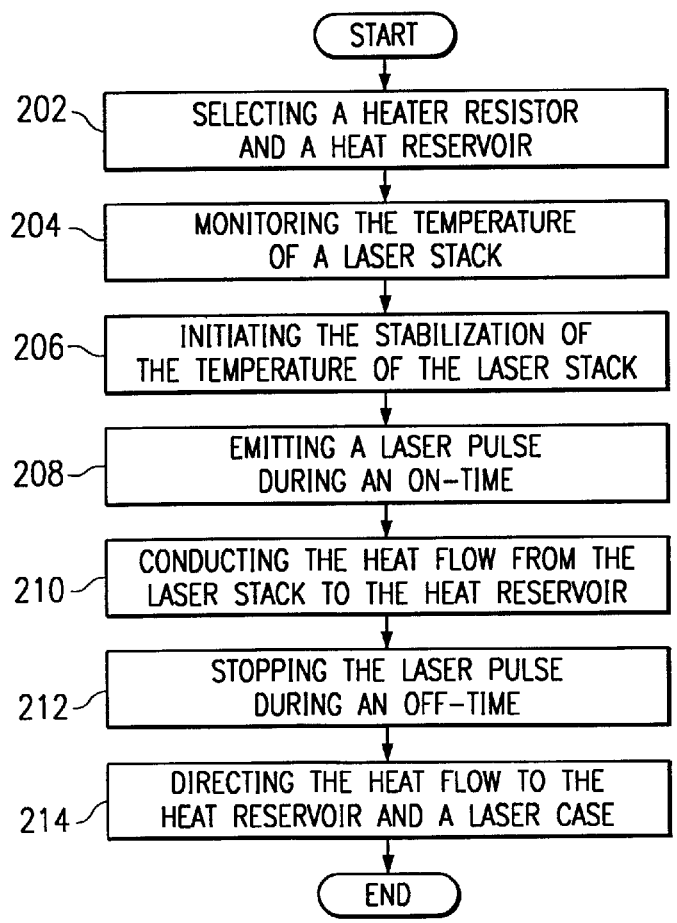
FIG. 2 is a flowchart demonstrating one embodiment of a method of generating laser light in accordance with the present invention.

FIG. 2 is a flowchart demonstrating one embodiment of a method of generating laser light in accordance with the present invention. In general, a pulsed laser system is off most of the time, meaning that the laser-on duty cycle, or on-time, is less than one half of the laser period. Normally, the on-time is less than one one-hundredth of the laser period. The on-time may last from picoseconds to as long as microseconds, and laser period may last from microseconds to seconds. During the laser on-time, transient heat flow go the heat reservoir 112 should be fast and efficient, removing heat that could easily damage the laser emitters 102, 104, and 106. Therefore, it is necessary to direct the heal flow originating from the laser stack 108 to quickly remove large transient amounts of heat, for example, millijoules to joules, in a short period of time, for example, nanoseconds to microseconds, but to conduct a minimal amount of heat overall, as averaged over the time length of one on-time period. This allows the laser stack 108 to run at a safe and predefined temperature, for example 35 to 75 degrees Celsius, such that every laser-on pulse begins when the laser emitter stack has passively settled to some predefined set temperature.

The thermal resistance and capacity of the heat reservoir 112 and the case spacer 116 may be engineered to conduct the appropriate amount of heat. The heat reservoir 112 should conduct the necessary amount of heat away from the laser stack 108, but not conduct too much heat in total as this would greatly increase the amount of electrical power required to maintain the quiescent operating temperature by a heater resistor 110. The case spacer 116 should conduct most of the average heat away from the laser stack 108, but at a predefined rate. Adjusting for a low thermal resistance and low thermal capacitance for the heat reservoir 112 and a high thermal resistance and high thermal capacitance for the case spacer 116 is one way to conduct the appropriate amount of heat. The heat reservoir 112 may have a resistance of 0.1 to 2 degrees Celsius per watt, and may have a capacitance of 0.001 to 0.1 joules per degree Celsius. The case spacer 116 may have a resistance of 5 to 20 degrees Celsius per watt, and may have a capacitance of 1 to 10 joules per degree Celsius. Once accomplished, a laser with a laser stack 108 that runs at a temperature above ambient, but below damage threshold, for example 100 to 150 degrees Celsius, can be operated and stabilized with minimal electrical power.

Specifically, the method begins with step 202, where the heater resistor 110, the case spacer 116, and the heat reservoir 112 are selected and constructed such that minimal heating and no cooling unit are required. The heater resistor 110 may be placed on the laser stack 108 in order to stabilize the temperature of laser stack 108, and not the entire laser assembly. The thermal resistance of the case spacer 116 may be sufficiently high to conduct little heat during the on-time and adequate heat during the off-time to keep the unit out of thermal run-away. The heat reservoir 112 may have sufficient thermal capacitance such that the reservoir 112 holds the transient heat generated by the laser stack 108 during the laser on-time, and conducts little total heat to the case spacer 116 during the laser off-time. In step 204, the temperature monitor 114 monitors the temperature of the laser stack 108. In step 206, the heater resistor 110 initiates stabilization of the temperature of the laser stack 108. In step 208, the laser stack 108 emits a laser pulse during an on-time period, raising the temperature of the laser stack 108. In step 210, the heat flow from the laser stack 108 is conducted through a thermal conductor to the heat reservoir 112. The thermal conductor may comprise, for example, the reservoir spacers 120, 122, and 124. In step 212, the laser emitters 102, 104, and 106 stop the laser pulse during an off-time. During the off-time, the heat reservoir 112 is allowed to cool. In step 214, the heat flow is directed through a thermal conductor to a laser case 118. The thermal conductor may comprise, for example, a case spacer 116. The heat flow may be directed such that the temperature of the laser stack 108 approximates the operating temperature during the off-time period.

A technical advantage of the present invention is that it does not require a cooling unit, resulting in a lowered power consumption and cost. Another technical advantage of the present invention is that only the temperature of the emitters, and not the entire laser assembly, is stabilized, lowering power consumption. Another technical advantage of the present invention is that the emitter heat flow is passively stabilized, again lowering power consumption.

Although an embodiment of the invention and its advantages are described in detail, a person skilled in the art could make various alternations, additions, and omissions without departing from the spirit and scope of the present invention as defined by the appended claims.

What is claimed is:

1. A laser system, the system comprising:
   a. one or more laser emitters forming a laser stack, wherein the laser emitters emit a laser pulse during an on-time and stop emitting the laser pulse during an off-time;
   b. a heater resistor coupled to the laser stack and for stabilizing a temperature of the laser stack;
   c. a heat reservoir coupled to the laser stack and for storing a heat flow from the laser stack during the on-time and release the heat flow to the laser stack during the off-time to maintain a specified temperature range of the laser stack;
   d. a case spacer coupled to the heat reservoir and for conducting the heat flow from the heat reservoir to maintain the specified temperature range of the laser stack, a thermal resistance of the case spacer being higher than a thermal resistance of the heat reservoir; and
   e. a temperature monitor coupled to the laser stack and for monitoring the temperature of the laser stack.

2. The system of claim 1 wherein the heat reservoir comprises diamond.

3. The system of claim 1 further comprising one or more thermal conductors for conducting heat to and from the laser stack.

4. The system of claim 2 wherein the thermal conductors comprise copper.

5. The system of claim 1 wherein the case spacer conducts heat flow such that the temperature of the laser stack falls to approximately a specified temperature within the specified temperature range during the off-time of the laser stack.

6. The system of claim 3 wherein the thermal conductors comprise one or more reservoir spacers coupled to the heat reservoir.

7. The system of claim 3 wherein the thermal conductors comprise one or more reservoir spacers coupled to the laser emitters.

8. The system of claim 1 further comprising a laser case coupled to the case spacer.

9. The system of claim 1 further comprising one or more recievers for receiving light emitted from the laser stack.

10. The system of claim 9 wherein the receivers comprise an output light coupling.

11. The system of claim 9 wherein the receivers comprise one or more optic fibers.

12. The system of claim 9 wherein the receivers comprise a lens.

13. A method for generating laser light, the method comprising:
   a. monitoring a temperature of a laser stack;
   b. initiating a stabilization of the temperature of the laser stack using a heater resistor;
   c. emitting a laser pulse during an on-time;
   d. conducting a heat flow from the laser stack to a heat reservoir during the on-time to maintain a specified temperature range of the laser stack;
   e. stopping the emission of the laser pulse during an off-time;
   f. directing the heat flow to a case spacer during the off-time to maintain the specified temperature range of the laser stack, a thermal resistance of the case spacer being higher than a thermal resistance of the heat reservoir; and
   g. directing the heat flow to the laser stack during the off-time to maintain the specified temperature range of the laser stack.

14. The method of claim 13 further comprising selecting the heater resistor and the heat reservoir such that no cooling unit is required.

15. The method of claim 13 wherein the conducting step further comprises conducting the heat flow through a thermal conductor to the heat reservoir.

16. The method of claim 13 wherein the directing step further comprises directing the heat flow through a thermal conductor to the case spacer.

17. The method of claim 13 wherein the directing step further comprises directing the heat flow such that the temperature of the laser stack approximates an operating temperature within the specified range during the off-time.

18. The method of claim 13 wherein the off-time is greater than the on-time.

19. A system for generating laser light, comprising:
   a. monitoring means for monitoring a temperature of a laser stack;
   b. initiating means for initiating a stabilization of the temperature of the laser stack using a heater resistor;
   c. emitting means for emitting a laser pulse during an on-time;
   d. conducting means for conducting a heat flow from the laser stack to a heat reservoir during the on-time to maintain a specified temperature range of the laser stack;
   e. stopping means for stopping the emission of the laser pulse during an off-time;
   f. directing means for directing the heat flow to a case spacer during the off-time to maintain the specified temperature range of the laser stack, a thermal resistance of the case spacer being higher than a thermal resistance of the heat reservoir; and
   g. directing means for directing the heat flow to the laser stack during the off-time to maintain the specified temperature range of the laser stack.

* * * * *